United States Patent [19]

Hyakutake

[11] Patent Number: 4,859,872
[45] Date of Patent: Aug. 22, 1989

[54] SYNCHRONIZING SIGNAL PROCESSING CIRCUIT

[75] Inventor: Junichi Hyakutake, Itami, Japan

[73] Assignee: Mitsubishi Denki Kabushiki Kaisha, Tokyo, Japan

[21] Appl. No.: 172,216

[22] Filed: Mar. 23, 1988

[30] Foreign Application Priority Data

Mar. 31, 1987 [JP] Japan .................................. 62-80820
Apr. 28, 1987 [JP] Japan .................................. 62-105585

[51] Int. Cl.$^4$ ...................... H03K 5/13; H03K 5/153; H03K 5/22; H04N 5/08
[52] U.S. Cl. .................................. 307/269; 307/480; 307/360; 307/352; 307/236; 307/555; 307/262; 307/264; 307/494; 328/72; 328/146; 328/147; 358/153; 358/154
[58] Field of Search ............... 307/269, 480, 494, 525, 307/526, 527, 355, 356, 357, 362, 552, 555, 262, 264, 360, 236, 352; 328/72, 133, 135, 146, 147, 149, 158, 173; 358/153, 154

[56] References Cited

U.S. PATENT DOCUMENTS

| | | | |
|---|---|---|---|
| 3,585,510 | 6/1971 | O'Malley | 307/262 |
| 3,593,035 | 7/1971 | Martens | 307/360 |
| 3,890,575 | 6/1975 | Tawfik | 328/146 |
| 3,965,388 | 6/1976 | Brisk | 307/355 |
| 4,061,932 | 12/1977 | Cordell | 307/360 |
| 4,456,840 | 6/1984 | Ide et al. | 307/262 |
| 4,560,890 | 12/1985 | Masuda et al. | 307/355 |
| 4,588,905 | 5/1986 | Kojima | 307/269 |
| 4,602,169 | 6/1986 | Shimizu | 307/355 |
| 4,723,165 | 2/1988 | Bart | 358/153 |

OTHER PUBLICATIONS

Grant, "Low Level Voltage Comparator", New Electronics, vol. 14, No. 8, Apr. 1981, p. 22.
Novak, "Diode Plus Op Amp Provide Double-Threshold Function", Electronics, Apr. 21, 1982, vol. 5, No. 8.
"Television Technics", published by Denshigijutsu Shuppansha in Feb. 1987, pp. 34-37.

*Primary Examiner*—Stanley D. Miller
*Assistant Examiner*—Trong Q. Phan
*Attorney, Agent, or Firm*—Oblon, Spivak, McClelland, Maier & Neustadt

[57] ABSTRACT

An input synchronizing signal is subjected to mean DC voltage adjustment so that the mean DC voltage thereof becomes a prescribed level. The input synchronizing signal after the mean DC voltage adjustment is compared with first reference voltage which is higher than the prescribed level and second reference voltage which is lower than the prescribed level by comparators, to derive an output synchronizing signal of constant polarity and amplitude or a polarity detection output for the input synchronizing signal.

9 Claims, 7 Drawing Sheets

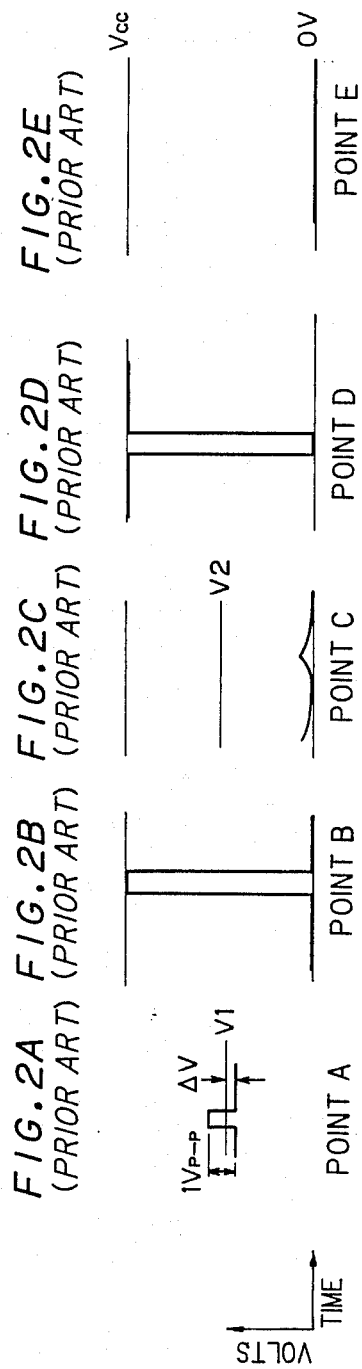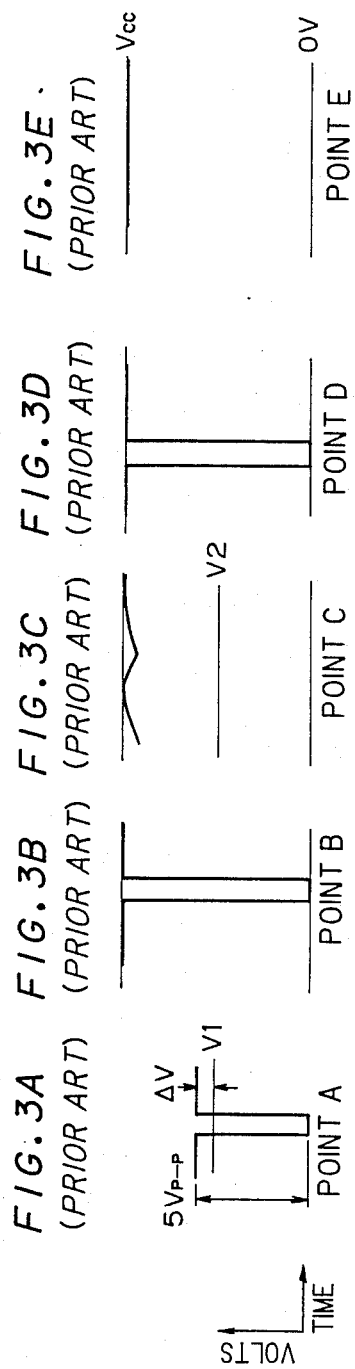

FIG.5
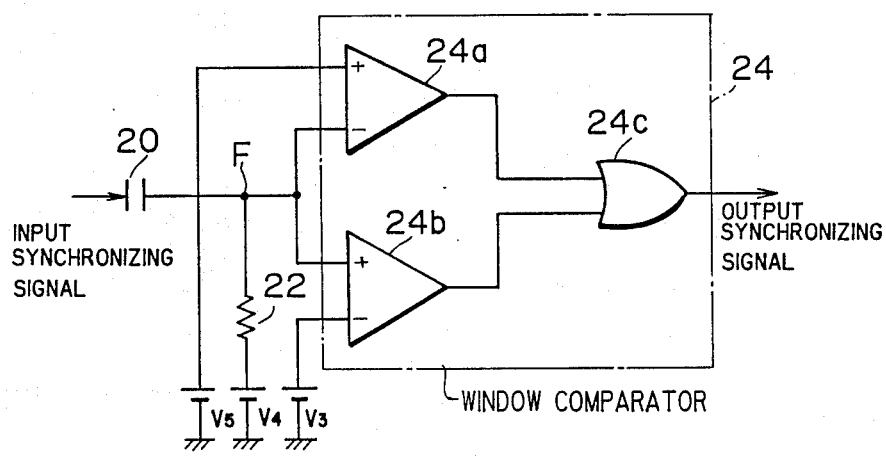
FIG.6C
OUTPUT
SYNCHRONIZING
SIGNAL
FIG.6A
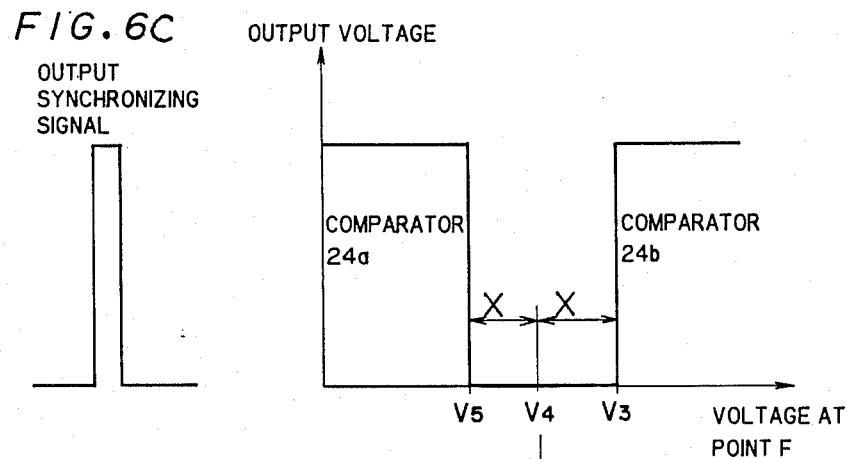
FIG.6B
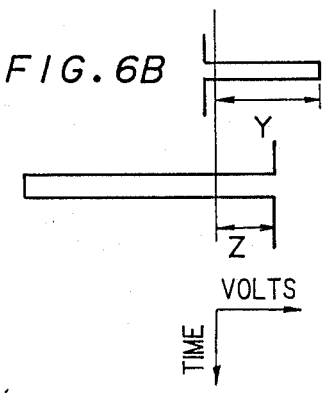

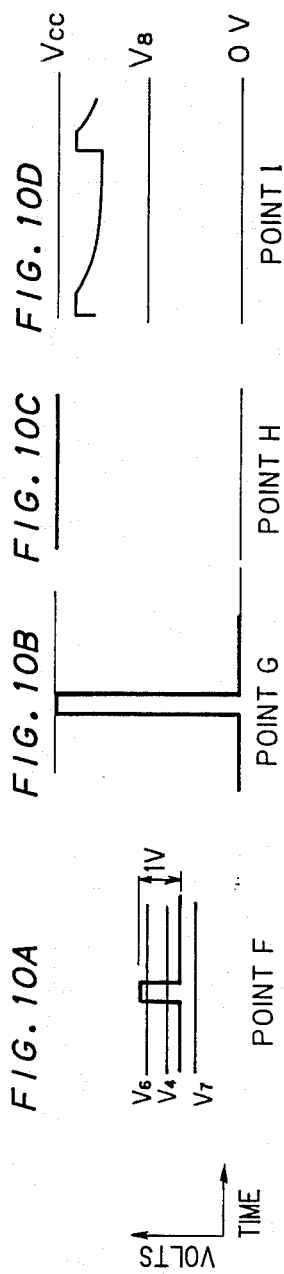

SYNCHRONIZING SIGNAL PROCESSING CIRCUIT

BACKGROUND OF THE INVENTION

1. Field of the Invention

The present invention relates to a synchronizing signal processing circuit for use in a monitor television, a display monitor and the like.

2. Description of the Prior Art

There are various types of synchronizing signals to be input to a display monitor etc. In one type, a horizontal synchronizing signal and a vertical synchronizing signal are input separately, and, in another type, they are input as a composite signal. Further, the synchronizing signals have amplitude of 1.0 to 5.0 $V_{p-p}$ and polarity of positive and negative. In order to process the synchronizing signals, the display monitor is provided with a synchronizing signal processing circuit having a polarity detection circuit for detecting polarity of the synchronizing signals. The output information from the polarity detection circuit is used to so waveform-shape the synchronizing signals that they always have the same amplitude and polarity. The output information is also used to perform control for changing a size of display area in response to the detected polarity, for example.

FIG. 1 is a circuit diagram showing a conventional synchronizing signal processing circuit. FIGS. 2A to 2D and FIGS. 3A to 3D show voltage waveforms at respective points A to D in the circuit shown in FIG. 1 in the case of positive polarity and amplitude of 1 $V_{p-p}$ and in the case of negative polarity and amplitude of 5 $V_{p-p}$, respectively. Referring to the figures, a synchronizing signal is input through a coupling capacitor 10 to be supplied to a plus input of a comparator 12 having a minus input to which reference voltage $V_1$ is applied. The comparator 12 compares the synchronizing signal with the reference voltage $V_1$ to output a signal having constant amplitude and the same polarity as the input synchronizing signal. The output signal from the comparator 12 is supplied to a low-pass filter 14 formed by a resistor 14a and a capacitor 14b. The low-pass filter 14 serves as a polarity detector to output a low-level voltage signal in the case of positive polarity input or a high-level voltage signal in the case of negative polarity input. An exclusive OR circuit 16 receives the output signals from the comparator 12 and the low-pass filter 14 to output a synchronizing signal of negative polarity and constant amplitude regardless of polarity and amplitude of the input synchronizing signal.

FIG. 4 is a circuit diagram showing a conventional polarity detection circuit. FIG. 2E and FIG. 3E show voltage waveforms at a point E in the circuit shown in FIG. 4 in the case of positive polarity and amplitude of 1 $V_{p-p}$ and in the case of negative polarity and amplitude of 5 $V_{p-p}$, respectively. Voltage waveforms at points A to C are similar to those shown in FIGS. 2A to 2C and FIGS. 3A to 3C. Referring to the figures, a comparator 18 receives an output signal from a low-pass filter 14 at its plus input to compare the same with reference voltage $V_2$ applied to its minus input. The level of the reference voltage $V_2$ is shown in FIG. 2C and FIG. 3C. Thus, the comparator 18 outputs a low-level voltage signal in the case of a positive polarity input synchronizing signal, as shown in FIG. 2E, or a high-level voltage signal in the case of a negative polarity input synchronizing signal, as shown in FIG. 3E.

The synchronizing signal processing circuit shown in FIG. 1 and the polarity detection circuit shown in FIG. 4 have following disadvantages:

First, if the input synchronizing signal has relatively small duty cycle, e.g. smaller than 1%, such as a vertical synchronizing signal, and relatively small amplitude, e.g. 1.0 $V_{p-p}$, difference voltage $\Delta V$ between the reference voltage $V_1$ and the reference voltage of the input synchronizing signal after capacitive coupling through the capacitor 10 becomes very small to decrease noise margin.

Secondly, when there is no input signal, the comparator 12 receives the same voltage at its two inputs to output a signal of indefinite level, i.e. high-level or low-level, according to input offset voltage of the comparator 12. Therefore, output signals from the synchronizing signal processing circuit shown in FIG. 1 and the polarity detection circuit shown in FIG. 4 are also indefinite. This makes design of an circuit in the post-stage of these circuits difficult.

Thirdly, it is difficult to form these circuits as an IC, since the low-pass filter 14 serving as a polarity detector includes the capacitor 14b which needs capacitance more than 1 $\mu F$ to sufficiently depress a frequency of the horizontal or vertical synchronizing signal. If they are formed as an IC, the IC must have a terminal to externally connect the capacitor 14b. Further, response speed of the low-pass filter 14 is relatively slow, and hence it takes relatively long time to obtain a normal output when polarity abruptly varies.

SUMMARY OF THE INVENTION

A synchronizing signal processing circuit according to the present invention comprises: mean DC voltage setting means for setting mean DC voltage of an input synchronizing signal at a prescribed level; and a window comparator having first reference voltage which is larger than said prescribed level and second reference voltage which is smaller than said prescribed level, for comparing the input synchronizing signal set by said mean DC voltage setting means with said first reference voltage and said second reference voltage to output a signal of a first level when the input synchronizing signal set by said mean DC voltage setting means is in a level between said first reference voltage and said second reference voltage and a signal of a second level when it is in a level higher than said first reference voltage or lower than said second reference voltage, whereby an output synchronizing signal of constant polarity and amplitude is obtained.

Accordingly, it is an object of the present invention to provide a synchronizing signal processing circuit with large noise margin, which can stably derive a definite output signal.

It is another object of the present invention to provide a synchronizing signal processing circuit suitable for an integrated circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2A to FIG. 2E and FIG. 3A to FIG. 3E show waveforms at points A to E in the circuit shown in FIG. 1;

FIG. 5 is a circuit diagram showing an embodiment of a synchronizing processing circuit according to the present invention;

FIG. 6A to FIG. 6C show waveforms in the circuit shown in FIG. 5;

FIG. 10A to FIG. 10D, FIG. 11A to FIG. 11D and FIG. 12A to FIG. 12D show waveforms at points F to I in the circuit shown in FIG. 9.

DESCRIPTION OF THE PREFERRED EMBODIMENTS

Figure 1:
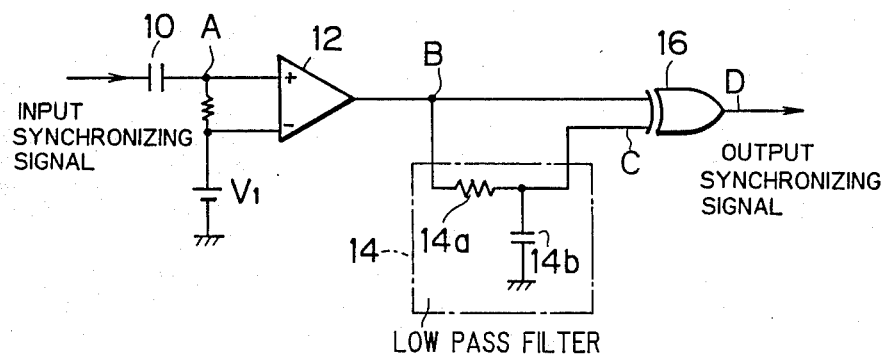
FIG. 1 is a circuit diagram showing a conventional synchronizing signal processing circuit.
Figure 4:
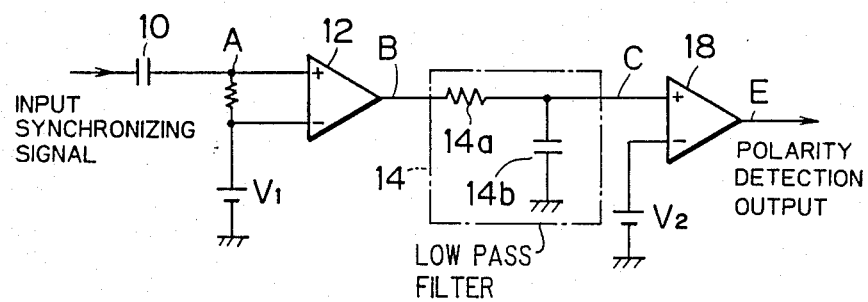
FIG. 4 is a circuit diagram showing a conventional polarity detection circuit for a synchronizing signal.

FIG. 5 is a circuit diagram showing an embodiment of a synchronizing signal processing circuit according to the present invention. Referring to FIG. 5, a synchronizing signal to be processed is input to one end of a coupling capacitor 20, the other end of which is connected to reference voltage $V_4$ through a resistor 22. Thus, the mean voltage of the input synchronizing signal after capacitive coupling is adjusted to become $V_4$.

The input synchronizing signal whose mean voltage has been adjusted is input to a window comparator 24 which is formed by comparators 24a and 24b and OR circuit 24c. The comparator 24a has a plus input to which reference voltage $V_5$ is applied and a minus input to which the input synchronizing signal whose mean voltage has been adjusted is applied, and the comparator 24b has a plus input to which the input synchronizing signal whose mean voltage has been adjusted is applied and minus input to which reference voltage $V_3$ is applied. The reference voltages are so set that $V_3 > V_4 > V_5$ is satisfied. Preferably, the reference voltage $V_4$ is set at the middle voltage between the reference voltages $V_3$ and $V_5$.

The comparator 24a compares the mean-voltage-adjusted input synchronizing signal with the reference voltage $V_5$ to output a high-level signal when the former is smaller than the latter. The comparator 24b compares the input synchronizing signal whose mean voltage has been adjusted with the reference voltage $V_3$ to output a high-level signal when the former is larger than the latter. The OR circuit 24c receives the output signals from the comparators 24a and 24b to perform OR-operation to derive an output synchronizing signal.

FIG. 6A shows the output signals from the comparators 24a and 24b, i.e., the output signal from the window comparator 24, with respect to voltage at a point F. As shown in FIG. 6A, the output signal from the window comparator 24 is in low-level when the voltage at the point F is in the level between the reference voltages $V_3$ and $V_5$ and in high-level when it is higher than the reference voltage $V_3$ or lower than the reference voltage $V_5$. Thus, the output synchronizing signal of constant amplitude and positive polarity is always obtained, regardless of amplitude and polarity of the input synchronizing signal, as shown in FIG. 6B to FIG. 6C. FIG. 6B shows the input synchronizing signals of positive polarity and negative polarity, and FIG. 6C shows the output synchronizing signal in the case.

Figure 7:
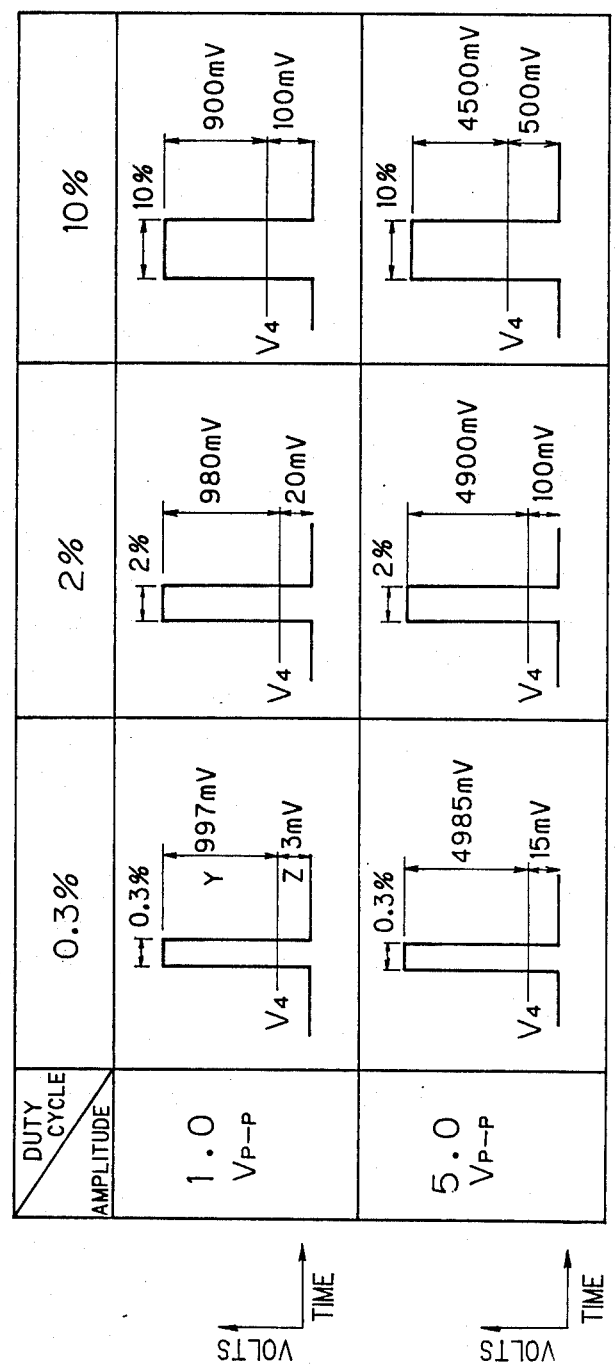
FIG. 7 shows various values of Y and Z in any combination of amplitude of 1.0 and 5.0 $V_{p\text{-}p}$ and duty cycle of 0.3, 2 and 10%.

The reference voltage $V_4$ may be so set that $V_3 - V_4 = V_4 - V_5 = X$ is satisfied. In this case, the value of X must be so selected that $Y > X > Z$ is always satisfied. FIG. 7 shows various values of Y and Z in any combination of amplitude of 1.0 and 5.0 $V_{p\text{-}p}$ and duty cycle of 0.3, 2 and 10%. In FIG. 7, the minimum value of Y is 900 mV and the maximum value of Z is 500 mV. Therefore, 900 mV $>$ X $>$ 500 mV must be satisfied. Preferably, X of approximately 700 mV may be selected. In this case, the reference voltage $V_3$ may be set at $V_4 + 700$ mV and the reference voltage $V_5$ may be set at $V_4 - 700$ mV. Thus, the positive and negative input synchronizing signals of amplitude of 1.0 to 5.0 $V_{p\text{-}p}$ can be converted to the output synchronizing signal of constant amplitude and positive polarity.

It is clear from the above description that an output synchronizing signal of constant amplitude and polarity can be always generated for various input synchronizing signals by using a window comparator and suitably setting mean DC voltage ($V_4$) of the input synchronizing signal and reference voltages ($V_3$, $V_5$) for comparison by the window comparator. Characteristics do not depend on the absolute values of the voltages $V_3$, $V_4$ and $V_5$ but depend on the differences therebetween. Therefore, accuracy is not so required in setting the voltages $V_3$, $V_4$ and $V_5$, and hence the synchronizing signal processing circuit according to the present invention can be easily formed as an IC.

In the case of no input signal, the output signal from the window comparator 24 is in low-level. Polarity of the output synchronizing signal from the window comparator 24 is always positive as hereinabove described, in which the low-level is inactive. Therefore, a circuit in the post-stage, to be connected to the window comparator 24, is never erroneously activated when there is no input signal. Further, even if a noise signal within ±700 mV is input, the output signal maintains a low-level. Thus, a relatively large noise margin is obtained and the noise margin increases as the difference voltage X increases.

The synchronizing signal processing circuit illustrated in FIG. 5 has no low-pass filter. Therefore, it responds quickly and can be easily formed as an IC because of unnecessity of a capacitor for a low-pass filter. Further, the IC needs fewer terminals than the conventional IC because of the unnecessity of the capacitor.

Figure 8:
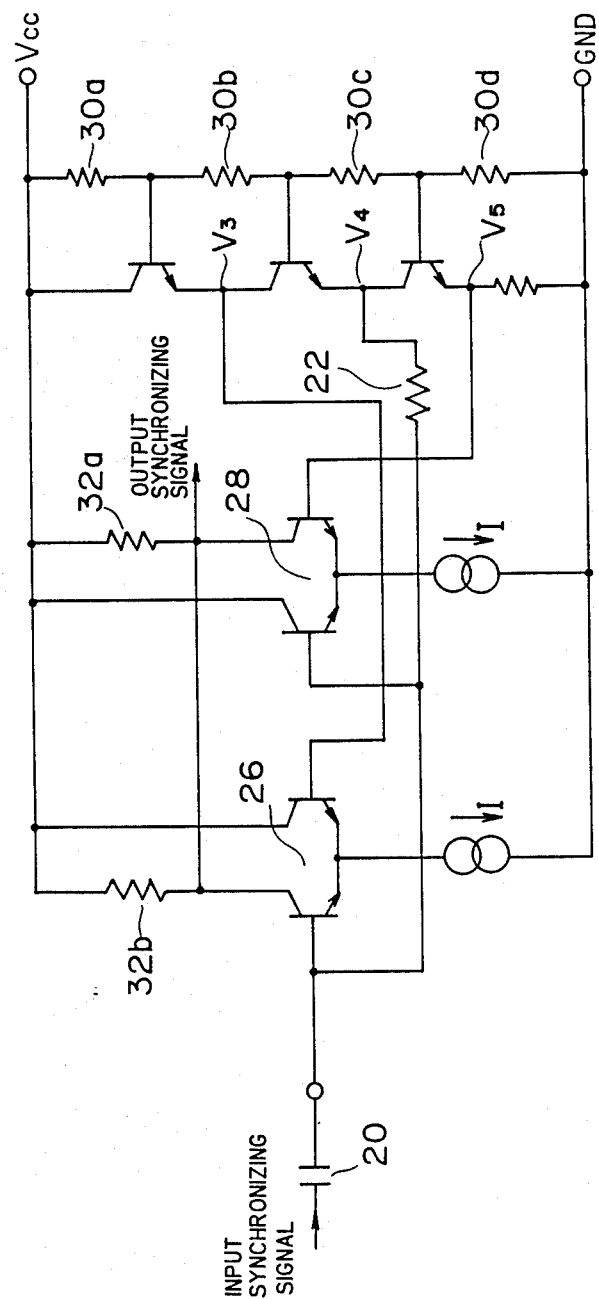
FIG. 8 is a circuit diagram showing another embodiment of the synchronizing signal processing circuit according to the present invention.

FIG. 8 is a circuit diagram showing another embodiment of the synchronizing signal processing circuit according to the present invention. This circuit structure is suitable for an IC. The window comparator 24 shown in FIG. 5 is replaced by differential amplifiers 26 and 28 in this embodiment. Reference voltages $V_3$, $V_4$ and $V_5$ are set by resistance ratio of resistors 30a to 30d. An output synchronizing signal has negative polarity, wherein its reference voltage, i.e. high-level voltage, is $V_{cc}$ and low-level voltage is ($V_{cc} - R \times I$), where R denotes resistance value of resistors 32a and 32b. When there is no input signal, an output signal maintains $V_{cc}$.

Figure 9:
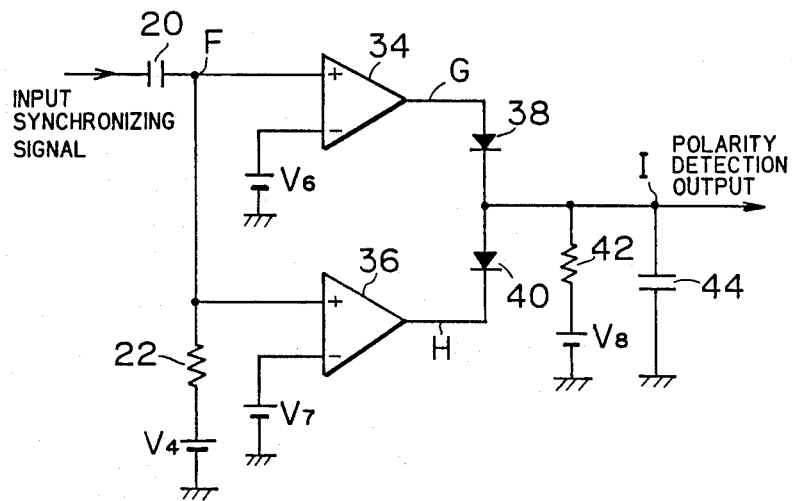
FIG. 9 is acircuit diagram showing still another embodiment of the synchronizing signal processing circuit according to the present invention.

FIG. 9 is a circuit diagram showing still another embodiment of the synchronizing signal processing circuit according to the present invention. The circuit serves as a polarity detection circuit for a synchronizing signal.

FIGS. 10A to 10D and FIGS. 11A to 11D show voltage waveforms at respective points F to I in the circuit shown in FIG. 9 in the case of an input synchronizing signal of positive polarity and amplitude of 1 $V_{p-p}$ and in the case of an input synchronizing signal of negative polarity and amplitude of 5 $V_{p-p}$, respectively. Referring to the figures, an input synchronizing signal is so adjusted through a coupling capacitor 20, a resistor 22 and reference voltage $V_4$ that the mean DC voltage thereof becomes $V_4$, as shown in FIG. 10A and FIG. 11A, similar to the embodiment shown in FIG. 5.

The input synchronizing signal thus adjusted with respect to the mean DC voltage is supplied to plus inputs of comparators 34 and 36 which have minus inputs to which reference voltages $V_6$ and $V_7$ are applied, respectively. The comparator 34 compares the input synchronizing signal with the reference voltage $V_6$ to output a high-level signal when the former is larger than the later, as shown in FIG. 10B and FIG. 11B. The comparator 36 compares the input synchronizing signal with the reference voltage $V_7$ to output a high-level signal when the former is larger than the later, as shown in FIG. 10C and FIG. 11C.

The mean DC voltage $V_4$ of the input synchronizing signal is so set that $V_6 > V_4 > V_7$, preferably $V_6 - V_4 = V_4 - V_7 = X$, is satisfied. Horizontal and vertical synchronizing signals generally have duty cycles of 2 to 10% and 0.3 to 2%, respectively, and amplitude of 1.0 to 5.0 $V_{p-p}$. Assuming that the duty cycle and the amplitude of the input synchronizing signal are 0.3 to 10% and 1.0 to 5.0 $V_{p-p}$, respectively, the value X is set at between 500 and 900 mV, preferably at approximately 700 mV, as hereinbefore described. When X=700 mV, the reference voltages $V_6$ and $V_7$ may be set at $V_4$+700 mV and $V_4$−700 mV, respectively.

A diode 38 conducts only when the output signal from the comparator 34 is in high-level, i.e., the polarity of the input synchronizing signal is positive, to charge a capacitor 44. Thus, voltage at a point I maintains approximately $V_{cc}$ in the case of a positive polarity input, as shown in FIG. 10D. On the other hand, a diode 40 conducts only when the output signal of the comparator 36 is in low-level, i.e., the polarity of the input synchronizing signal is negative, to discharge the capacitor 44. Thus, the voltage at the point I maintains approximately 0V in the case of a negative polarity input, as shown in FIG. 11D. When there is no input signal, both of the diodes 34 and 36 are in nonconduction state, and hence the capacitor 44 is charged with reference voltage $V_8$ through a resistor 42. Thus, the voltage at the point I maintains $V_8$ in the case of no input signal, as shown in FIG. 12D.

Thus, the polarity of the input synchronizing signal of amplitude of 1.0 to 5.0 $V_{p-p}$ and no input signal duration are detected through the voltage level of the point I. Even if noise of amplitude within ±X (preferably 700 mV) is applied when there is no input signal, as shown in FIG. 12A, the output signals from the comparators 34 and 36 maintain 0V (low-level) and $V_{cc}$ (high-level), respectively, as shown in FIG. 12B and FIG. 12C. Therefore, the voltage at the point I stably maintains the correct level $V_8$.

Resistance value of the resistor 42 and capacitance value of the capacitor 44 may be suitably selected in accordance with duty cycle of the input synchronizing signal. The diodes 38 and 40 may be replaced by other appropriate switching means. A correct polarity detection output can be obtained, even if the comparators 34 and 35 have offset voltage to some extent. Characteristics do not depend on the absolute values of the reference voltages $V_4$, $V_6$ and $V_7$ but depend on the differences in amplitude therebetween, and hence accuracy is not so required in setting the reference voltages $V_4$, $V_6$ and $V_7$. The synchronizing signal processing circuit for polarity detection is suitable for an IC, since it has only one capacitor for retaining a voltage level and the polarity detection signal can be output through only one output pin.

Figure 13:
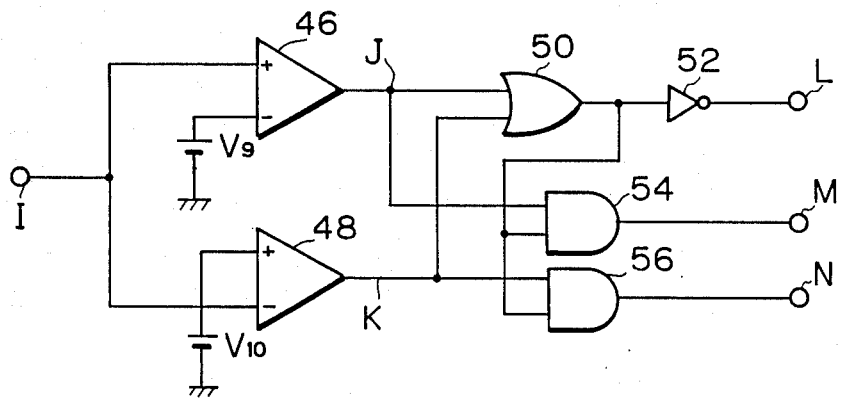
FIG. 13 shows a circuit employed for changing a polarity detection output from the circuit shown in FIG. 9 to a digital signal.

A circuit illustrated in FIG. 13 may be employed in order to completely change the polarity detection output from the circuit shown in FIG. 9 to a digital signal. Referring to FIG. 13, the polarity detection output is input to a plus input of a comparator 46 having a minus input to which reference voltage $V_9$ is applied and a minus input of a comparator 48 having a plus input to which reference voltage $V_{10}$ is applied. The reference voltage $V_9$ is so set that it is larger in amplitude than the reference voltage $V_8$ and smaller than the voltage at the point I in the case of a positive polarity input. The reference voltage $V_{10}$ is so set that it is smaller than the reference voltage $V_8$ and larger than the voltage at the point I in the case of a negative polarity input.

Output signals from the comparators 46 and 48 are processed through a OR circuit 50, an inverter 52 and AND circuits 54 and 56 to obtain a polarity detection digital signal. Voltage levels at points J to N are as follows:

| state of input | J | K | L | M | N |
| --- | --- | --- | --- | --- | --- |
| positive polarity | H | L | L | H | L |
| negative polarity | L | H | L | L | H |
| no input signal | L | L | H | L | L | where "H" represents a high-level and "L" represents a low-level. Only one of the points L to N becomes high-level in accordance with a state of input.

The synchronizing signal processing circuit according to the present invention is applicable to a composite synchronizing signal in addition to horizontal and vertical synchronizing signals, since the composite synchronizing signal, which is composition of horizontal and vertical synchronizing signals, has duty cycle almost equal to that of the horizontal synchronizing signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronizing signal processing circuit comprising:
   mean DC voltage setting means for setting mean DC voltge of an input synchronizing signal at a prescribed level including a coupling capacitor for receiving said input synchronizing signal at its one end, and a voltage source connected to the other end of said coupling capacitor; and
   a window comparator having first reference voltage which is larger than said prescribed level and second reference voltage which is smaller than said prescribed level, for comparing the input synchronizing signal set by said main DC voltage setting means with said first reference voltage and said second reference voltage to output a signal of a first level when the input synchronizing signal set by said mean DC voltage setting means is in a level between said first reference voltage and said second reference voltage and a signal of a second level when it is in a level higher than said first reference voltage or lower than said second reference voltage, thereby an output synchronizing signal of constant polarity and amplitude is obtained.

2. A synchronizing signal processing circuit in accordance with claim 1, wherein said window comparator comprises:

a first comparator for comparing the input synchronizing signal set by said mean DC voltage setting means with said first reference voltage; and a second comparator for comparing the input synchronizing signal set by said mean DC voltage setting means with said second reference voltage.

3. A synchronizing signal processing circuit in accordance with claim 2, wherein said first comparator includes a first differential pair of transistors having bases to which the input synchronizing signal set by said mean DC voltage setting means and said first reference voltage are applied, respectively, and said second comparator includes a second differential pair of transistors having bases to which the input synchronizing signal set by said mean DC voltage setting means and said second reference voltage are applied, respectively, one collector of the second differential pair of transistors being coupled to one collector of said first differential pair of transistors to derive the output synchronizing signal.

4. A synchronizing signal processing circuit comprising:

mean DC voltage setting means for setting mean DC voltage of an input synchronizing signal at a prescribed level;

a first comparator having first reference voltage which is larger than said prescribed level, for comparing the input synchronizing signal set by said mean DC voltage setting means with said first reference voltage;

a second comparator having second reference voltage which is smaller than said prescribed level, for comparing the input synchronizing signal set by said mean DC voltage setting means with said second reference voltage; and polarity detection means for detecting polarity of said input synchronizing signal based on comparison outputs from said first and second comparators.

5. A synchronizing signal processing circuit in accordance with claim 4, wherein said mean DC voltage setting means comprises:

a coupling capacitor for receiving said input synchronizing signal at its one end; and a voltage source coupled to the other end of said coupling capacitor.

6. A synchronizing signal processing circuit in accordance with claim 5, wherein said polarity detection means includes voltage retention means for retaining a voltage level of said comparison outputs from said first and second comparators.

7. A synchronizing signal processing circuit in accordance with claim 6, wherein said voltage retention means comprises:

a first diode for inputting a positive polarity output signal from said first comparator;

a second diode for inputting a negative polarity output signal from said second comparator;

time constant means for holding a voltage level of said positive or negative polarity output signal from said first or second diode.

8. A synchronizing signal processing circuit in accordance with claim 7, wherein said polarity detection means further includes means for outputting a prescribed level connected to said voltage retention means when there is no change in said comparison outputs from said first and second comparator.

9. A synchronizing signal processing circuit in accordance with claim 8, wherein said voltage retention means further comprises bias means connected to said time constant means for biasing said time constant means to hold a prescribed voltage level when there is no signal from said first and second diodes.

* * * * *